United States Patent
Roh et al.

(10) Patent No.: US 12,409,404 B2
(45) Date of Patent: Sep. 9, 2025

(54) SCRUBBER SYSTEM AND WET CLEANING METHOD USING THE SAME

(71) Applicant: Samsung Electronics Co., Ltd., Suwon-si (KR)

(72) Inventors: Young Seok Roh, Suwon-si (KR); Suji Gim, Hwaseong-si (KR); Heesub Kim, Busan (KR); Hee Ock Park, Suwon-si (KR); Jongyong Bae, Hwaseong-si (KR); Sung Chul Yoon, Hwaseong-si (KR); Sunsoo Lee, Yongin-si (KR); Dong Keun Jeon, Hwaseong-si (KR); Jinkyoung Joo, Gwangmyeong-si (KR)

(73) Assignees: Samsung Electronics Co., Ltd., Gyeonggi-do (KR); Global Standard Technology Co., LTD, Gyeonggi-do (KR)

( * ) Notice: Subject to any disclaimer, the term of this patent is extended or adjusted under 35 U.S.C. 154(b) by 0 days.

(21) Appl. No.: 18/442,528

(22) Filed: Feb. 15, 2024

(65) Prior Publication Data

US 2024/0181380 A1 Jun. 6, 2024

Related U.S. Application Data

(62) Division of application No. 17/502,463, filed on Oct. 15, 2021, now Pat. No. 11,931,683.

(30) Foreign Application Priority Data

Jan. 19, 2021 (KR) .................. 10-2021-0007386

(51) Int. Cl.
*B01D 47/06* (2006.01)
*H01J 37/32* (2006.01)
*B08B 9/08* (2006.01)

(52) U.S. Cl.
CPC ........ *B01D 47/06* (2013.01); *H01J 37/32844* (2013.01); *B08B 9/0813* (2013.01)

(58) Field of Classification Search
CPC .... H01J 37/32844; B01D 47/05; B01D 47/06
See application file for complete search history.

(56) References Cited

U.S. PATENT DOCUMENTS 4,266,951 A * 5/1981 Calvert .................. B01D 45/04
239/545
6,217,640 B1 4/2001 Lu et al.
(Continued)

FOREIGN PATENT DOCUMENTS

CN 105169872 A 12/2015
JP 2019-521841 A 8/2019
(Continued)

OTHER PUBLICATIONS

Machine translation of JP 6718566 B1, dated Jul. 8, 2020. (Year: 2020).*

(Continued)

*Primary Examiner* — Michael E Barr
*Assistant Examiner* — Kevin G Lee
(74) *Attorney, Agent, or Firm* — Harness, Dickey & Pierce, P.L.C.

(57) ABSTRACT

A scrubber system may include a scrubber housing including a vertically extended cleaning space, an inflow chamber coupled to a bottom portion of the scrubber housing, and first and second inflow portions, each of which is configured to supply a gas into the inflow chamber. The inflow chamber may include a mixing space, and the mixing space may be connected to the cleaning space. The first inflow portion may include a first connection pipe coupled to the inflow chamber to provide a first connection path and the second inflow portion may include a second connection pipe coupled to the (Continued)

inflow chamber to provide a second connection path. The first and second connection paths may be extended toward the mixing space in opposite directions, respectively, and may be connected to opposite portions of the mixing space, respectively.

11 Claims, 16 Drawing Sheets

(56) References Cited

U.S. PATENT DOCUMENTS

| | | |
|---|---|---|
| 6,423,278 B2 | 7/2002 | Choi |
| 10,563,553 B2 | 2/2020 | Bahadur Thapa et al. |

FOREIGN PATENT DOCUMENTS

| | | | |
|---|---|---|---|
| JP | 6718566 B1 * | 7/2020 | ............. B01D 47/02 |
| KR | 10-2000-0062400 A | 10/2000 | |
| KR | 100307808 B1 | 9/2001 | |
| KR | 100373491 B1 | 2/2003 | |
| KR | 100623368 B1 | 9/2006 | |
| KR | 100669501 B1 | 1/2007 | |
| KR | 100711941 B1 | 5/2007 | |
| KR | 101442781 B1 | 9/2014 | |
| KR | 10-1493245 B1 | 2/2015 | |
| KR | 101520174 B1 | 5/2015 | |
| KR | 101635065 B1 | 7/2016 | |
| KR | 102023950 B1 | 9/2019 | |

OTHER PUBLICATIONS

Machine Translation of JP-6718566-B1, dated Jul. 2020. (Year: 2020).

* cited by examiner

SCRUBBER SYSTEM AND WET CLEANING METHOD USING THE SAME

CROSS-REFERENCE TO RELATED APPLICATIONS

This is a divisional of U.S. application Ser. No. 17/502,463, filed Oct. 15, 2021, which claims priority to Korean Patent Application No. 10-2021-0007386, filed on Jan. 19, 2021, the disclosures of each of which are hereby incorporated by reference in their entirety.

BACKGROUND

The present disclosure relates to scrubber systems and wet cleaning methods using the same, and in particular, to scrubber systems, which are configured to produce powder using a gas-to-gas collision process, and wet cleaning methods using the same.

A semiconductor chip is fabricated by performing various processes on a silicon wafer. For example, deposition, etching, developing, and/or electroplating processes are performed to fabricate the semiconductor chip. In addition, various materials of liquid, gaseous, and/or plasma states are used in the process of fabricating the semiconductor chip. A process gas, which is exhausted from a process chamber during the chip fabrication process, may contain several contamination materials that are harmful to humans or environment. Thus, it is beneficial to perform a cleaning operation of removing the contamination material from the process gas, before exhausting the process gas to the outside. A scrubber is used for this cleaning operation.

SUMMARY

Some example embodiments of the inventive concepts provide scrubber systems, which are configured to produce powder using a gas-to-gas collision process, and wet cleaning methods using the same.

Some example embodiments of the inventive concepts provide highly-efficient scrubber systems and wet cleaning methods using the same.

Some example embodiments of the inventive concepts provide a scrubber system, which is configured to perform a scrubbing or cleaning process using a hydrolysis reaction, and a wet cleaning method using the same.

Some example embodiments of the inventive concepts provide a scrubber system, which is configured to effectively perform a cleaning process using just a small amount of water, and a wet cleaning method using the same.

Some example embodiments of the inventive concepts provide a scrubber system having a simplified structure and a cost-effective wet cleaning method using the same.

Some example embodiments of the inventive concepts provide scrubber systems, which are configured to prevent or reduce the occurrence of a pipe clogging issue, and a wet cleaning method using the same.

According to some example embodiments of the inventive concepts, a scrubber system may include a scrubber housing including a cleaning space, the cleaning space being vertically extended, an inflow chamber coupled to a bottom portion of the scrubber housing, a first inflow portion configured to supply a first gas into the inflow chamber, a second inflow portion configured to supply a second gas into the inflow chamber, and a wet tank below the scrubber housing to including a storage space. The inflow chamber may include a mixing space, and the inflow chamber may be open toward the cleaning space such that the mixing space is connected to the cleaning space. The first inflow portion may include a first connection pipe, the first connection pipe being coupled to the inflow chamber and includes a first connection path, and the second inflow portion may include a second connection pipe, the second connection pipe being coupled to the inflow chamber and includes a second connection path. The first connection path may be extended toward the mixing space or in a horizontal direction and may be connected to the mixing space, and the second connection path may be extended toward a direction, the direction being opposite to an extension direction of the first connection path, and may be connected to the mixing space.

According to some example embodiments of the inventive concepts, a scrubber system may include a scrubber housing including a cleaning space, the cleaning space being extended in a first direction, an inflow chamber coupled to a bottom portion of the scrubber housing, the inflow chamber including a mixing space connected to the cleaning space, a first inflow portion configured to supply a gas into the inflow chamber, and a mixing gas supplying part configured to supply a mixing gas into the inflow chamber. The inflow chamber may be opened toward the cleaning space, and the first inflow portion may include a first connection pipe, the first connection pipe being coupled to the inflow chamber. The mixing gas supplying part may include a mixing gas nozzle, the mixing gas nozzle being coupled to the inflow chamber and is configured to spray the mixing gas into the mixing space. The first connection pipe may include a first connection path, the first connection path being extended in a second direction crossing the first direction and connected to the mixing space, and the mixing gas nozzle may be configured to spray the mixing gas in a direction crossing both of the first and second directions.

According to some example embodiments of the inventive concepts, a scrubber system may include a scrubber housing including a cleaning space, the cleaning space being vertically extended, an inflow chamber coupled to a bottom portion of the scrubber housing, a first inflow portion configured to supply a first gas from a first process chamber into the inflow chamber, and a second inflow portion configured to supply a second gas from a second process chamber into the inflow chamber. The inflow chamber may include a mixing space. A top portion of the inflow chamber may be opened toward the cleaning space such that the mixing space is connected to the cleaning space. The first inflow portion may include a first connection pipe including a first connection path, and the second inflow portion may include a second connection pipe including a second connection path. The first connection pipe may be coupled to a first portion of the inflow chamber to connect the first connection path to the mixing space, and the second connection pipe may be coupled to a second portion of the inflow chamber, the second portion of the inflow chamber being opposite to the first connection pipe, to connect the second connection path to the mixing space.

According to some example embodiments of the inventive concepts, a wet cleaning method may include supplying a first gas from a first process chamber into an inflow chamber through a first inflow portion, supplying a second gas from a second process chamber into the inflow chamber through a second inflow portion, colliding the first and second gases with each other within the inflow chamber, rising the first and second gases toward a scrubber housing that is placed on the inflow chamber, downwardly spraying a cleaning solution through a spray nozzle in the scrubber housing, and hydrolyzing an ingredient, the ingredient being included in at least one of the first gas or the second gas, with the cleaning solution sprayed through the spray nozzle.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
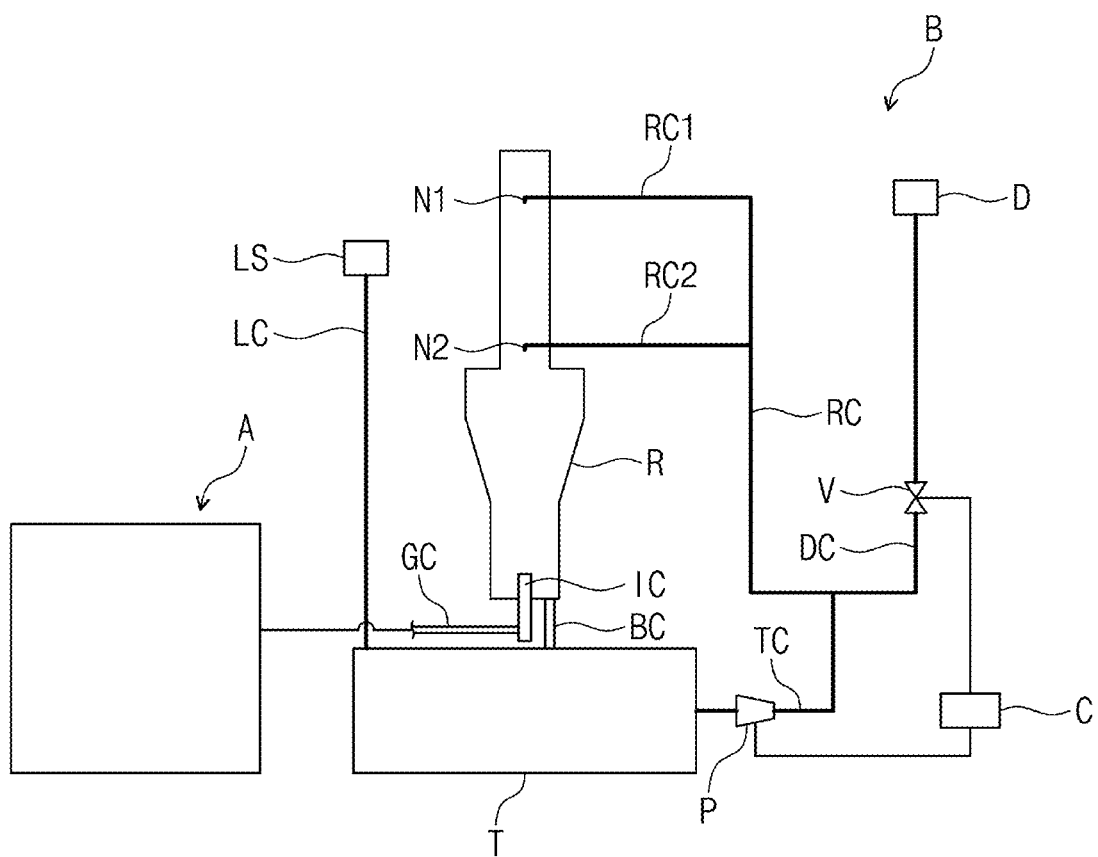
FIG. 1 is a schematic diagram illustrating a scrubber system according to some example embodiments of the inventive concepts.

FIG. 1 is a schematic diagram illustrating a scrubber system according to some example embodiments of the inventive concepts.

Referring to FIG. 1, a scrubber system B may be provided. The scrubber system B may be connected to a process chamber A. The scrubber system B may be configured to clean a gas, which is exhausted from the process chamber A. For example, in the case where the gas in the process chamber A is exhausted to the scrubber system B, the scrubber system B may be configured to perform a cleaning process of removing a harmful material from the gas.

The process chamber A may mean a semiconductor process chamber. In other words, the process chamber A may be a chamber that is used to perform various unit processes on a semiconductor wafer and/or a semiconductor chip. For example, the process chamber A may be a chamber that is used to perform a deposition process, an etching process, a developing process, and/or an electroplating process. More specifically, the process chamber A may be a chamber that is used to perform an atomic layer deposition (ALD) process on a semiconductor wafer or the like. However, the inventive concepts are not limited to this example, and the process chamber A may be a chamber that is used for any process producing a gas containing a harmful material.

In some example embodiments, a plurality of process chambers A may be provided. For example, although not shown in FIG. 1, two or more process chambers A may be provided. More specifically, the number of the process chambers A may be two, four, or larger. The plurality of the process chambers A may be connected to one scrubber system B. In other words, the gas may be exhausted from the plurality of the process chambers A to the scrubber system B. The scrubber system B may be configured to perform a cleaning operation on the gas, which are supplied from the plurality of the process chambers A. However, the inventive concepts are not limited to this example, and only one process chamber A may be connected to one scrubber system B. Some example embodiments with one process chamber A will be described in more detail below.

The scrubber system B may include a scrubber housing R, an inflow chamber IC, an inflow portion GC, spray nozzles N1 and N2, a discharge pipe BC, a wet tank T, a tank connection pipe TC, a discharge pump P, a re-supply pipe RC, a drain pipe DC, a discharge valve V, a drain device D, a cleaning solution supply device LS, a cleaning solution supply pipe LC, and a control unit C.

The scrubber housing R may be vertically extended. The scrubber housing R may be configured to have a space that is used to perform a cleaning operation on a gas exhausted from the process chamber A. For example, the scrubber housing R may have a cleaning space Rh (e.g., see FIG. 2), which is vertically extended. The gas in the process chamber A may be supplied into the scrubber housing R through the inflow portion GC and the inflow chamber IC. If the gas is supplied into the scrubber housing R, a harmful material in the gas may be dissolved, hydrolyzed, and/or otherwise neutralized by a cleaning solution sprayed from the spray nozzles N1 and N2 in a downward direction. This will be described in more detail below.

The inflow chamber IC may be coupled to the scrubber housing R. More specifically, the inflow chamber IC may be coupled to a bottom portion of the scrubber housing R. The inflow chamber IC may create an airflow path to the interior of the scrubber housing R. The gas may be supplied into the scrubber housing R through the inflow chamber IC.

The inflow portion GC may connect the process chamber A to the inflow chamber IC. The inflow portion GC may include a pipe, through which the gas flows, and a compressor, which accelerates the gas flowing through the pipe. The gas, which is exhausted from the process chamber A, may be supplied into the inflow chamber IC through the inflow portion GC. In other words, the inflow portion GC may create an airflow path through the inflow chamber IC connecting the process chamber A. Although not shown in FIG. 1, a plurality of the inflow portions GC may be connected in common to the inflow chamber IC. For example, in the case where a plurality of the process chambers A are provided, the inflow portion GC may also be provided in plural and may be connected in common to the inflow chamber IC. This will be described in more detail below.

The spray nozzles N1 and N2 may be located in the scrubber housing R. In some example embodiments, a plurality of spray nozzles N1 and N2 may be provided. For example, the spray nozzle may include a first spray nozzle N1 and a second spray nozzle N2. The first and second spray nozzles N1 and N2 may be configured to spray a cleaning solution. More specifically, the first and second spray nozzles N1 and N2 may be disposed in the scrubber housing R to spray the cleaning solution in a downward direction. A harmful material in the gas, which is exhausted from the process chamber A, may dissolved, hydrolyzed, and/or otherwise neutralized by the cleaning solution, which is sprayed from the first and second spray nozzles N1 and N2. The first and second spray nozzles N1 and N2 may be vertically separated from each other. For example, the first spray nozzle N1 may be located above the second spray nozzle N2. The cleaning solution may be supplied to the first and second spray nozzles N1 and N2 through the re-supply pipe RC. This operation will be described in more detail below.

The discharge pipe BC may be coupled to the scrubber housing R. More specifically, the discharge pipe BC may be placed near (e.g., on) a bottom surface of the scrubber housing R. The discharge pipe BC may be extended toward the wet tank T or in a downward direction. The discharge pipe BC may connect an internal space of the scrubber housing R to the wet tank T. The cleaning solution, which is sprayed from the spray nozzles N1 and N2 into the scrubber housing R, may be drained to the wet tank T through the discharge pipe BC.

The wet tank T may be disposed below the scrubber housing R. More specifically, the wet tank T may be disposed below the inflow chamber IC. For example, the inflow chamber IC may be separated from the wet tank T. The wet tank T may store the cleaning solution exhausted through the discharge pipe BC. The wet tank T may be configured to have a storage space Th (e.g., see FIG. 2), in which the cleaning solution is stored.

The tank connection pipe TC may be connected to the wet tank T. The tank connection pipe TC may be used to drain the cleaning solution, which is stored in the wet tank T, to the outside of the wet tank T.

The discharge pump P may be coupled to the tank connection pipe TC. The discharge pump P may be configured to provide a fluid-driving power to the tank connection pipe TC. The cleaning solution in the wet tank T may be exhausted to the outside through the tank connection pipe TC by the discharge pump P.

The re-supply pipe RC may be connected to the tank connection pipe TC. The re-supply pipe RC may be connected to a first re-supply pipe RC1 and a second re-supply pipe RC2 which diverge from the re-supply pipe RC. The first re-supply pipe RC1 may be connected to the first spray nozzle N1. The second re-supply pipe RC2 may be connected to the second spray nozzle N2. The cleaning solution in the wet tank T may be re-supplied to the first spray nozzle N1 through the tank connection pipe TC, the re-supply pipe RC, and the first re-supply pipe RC1. The first spray nozzle N1 may spray the cleaning solution, which is supplied through the first re-supply pipe RC1, into the scrubber housing R. Similarly, the cleaning solution in the wet tank T may be re-supplied to the second spray nozzle N2 through the tank connection pipe TC, the re-supply pipe RC and the second re-supply pipe RC2. The second spray nozzle N2 may spray the cleaning solution, which is supplied through the second re-supply pipe RC2, into the scrubber housing R.

The drain pipe DC may be connected to the tank connection pipe TC. The drain pipe DC may be connected to the drain device D. In other words, the drain pipe DC may connect the wet tank T to the drain device D.

The discharge valve V may be coupled to the drain pipe DC. The supplying of the cleaning solution to the drain pipe DC may be allowed or blocked by an open/close operation of the discharge valve V. If the discharge valve V is opened, a portion of the cleaning solution, which is stored in the wet tank T, may be drained to the drain device D through the drain pipe DC. For example, if the cleaning solution is saturated with a specific material of the gas, the discharge valve V may be opened by the control unit C to drain a portion of the cleaning solution to the drain device D.

The drain device D may be connected to the drain pipe DC. The drain device D may be configured to store the cleaning solution, which may be saturated with the specific material, or to exhaust the cleaning solution to the outside.

The cleaning solution supply device LS may be connected to the wet tank T. The cleaning solution supply device LS may supply an uncontaminated (or, alternatively, unused) cleaning solution to the wet tank T. For example, in the case where the cleaning solution stored in the wet tank T is saturated by the gas, at least a portion of the cleaning solution in the wet tank T may be drained to the drain device D by the drain pipe DC. For example, the operation of draining the cleaning solution from the wet tank T to the drain pipe DC may be performed when the cleaning solution stored in the wet tank T has a desired level of the gas dissolved within. For example, the operation of draining the cleaning solution from the wet tank T to the drain pipe DC may be performed periodically. If a portion of the cleaning solution is drained, an amount of the cleaning solution circulating the wet tank T and the re-supply pipe RC may be reduced. The cleaning solution supply device LS may supply the uncontaminated (or, alternatively, unused) cleaning solution to the wet tank T by a reduced amount.

The cleaning solution supply pipe LC may connect the cleaning solution supply device LS to the wet tank T. The cleaning solution supply pipe LC may be used to supply the uncontaminated (or, alternatively, unused) cleaning solution from the cleaning solution supply device LS to the wet tank T.

The control unit C may control the discharge valve V, the discharge pump P, the cleaning solution supply device LS, and so forth. For example, in the case where it is necessary to drain the cleaning solution from the wet tank T, the control unit C may open the discharge valve V. If the drain process is finished, the control unit C may close the discharge valve V. The operation of opening and closing the discharge valve V may be periodically performed under the control of the control unit C. When the cleaning solution in the wet tank T is insufficient, the control unit C may supply the uncontaminated (or, alternatively, unused) cleaning solution to the wet tank T by controlling the cleaning solution supply device LS.

Hereinafter, a portion of the scrubber system B will be described in more detail with reference to FIGS. 2 to 4.

Figure 2:
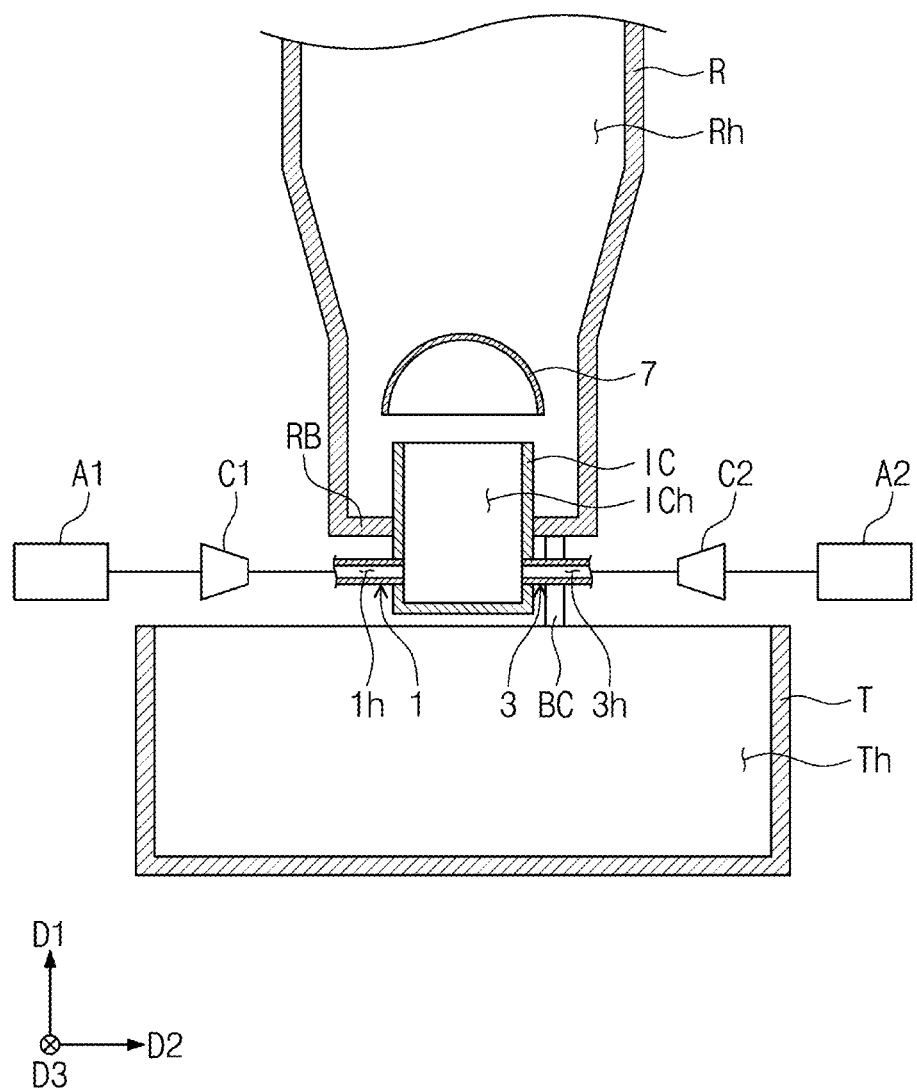
FIG. 2 is a sectional view illustrating a portion of a scrubber system according to some example embodiments of the inventive concepts.

FIG. 2 is a sectional view illustrating a portion of a scrubber system according to some example embodiments of the inventive concepts.

Hereinafter, three directions D1, D2, and D3 illustrated in FIG. 2 will be referred to as first, second, and third directions, respectively, and in this case, the first, second, and third directions D1, D2, and D3 may not be parallel to each other.

Referring to FIG. 2, the scrubber housing R may provide the cleaning space Rh. The cleaning space Rh may be vertically extended. In other words, the cleaning space Rh may be extended in the first direction D1. An operation of cleaning a gas may be performed in the cleaning space Rh.

An inflow chamber protection member 7 may be provided in the cleaning space Rh. The inflow chamber protection member 7 may be located between the inflow chamber IC and the spray nozzles N1 and N2 (e.g., see FIG. 1). The inflow chamber protection member 7 may be spaced apart from the inflow chamber IC in an upward direction. The inflow chamber protection member 7 may have an upwardly convex shape, although other shapes may be used. For example, the inflow chamber protection member 7 may be a dome-shaped element. The inflow chamber protection member 7 may prevent or reduce the occurrence of the cleaning solution, which is sprayed from the spray nozzles N1 and N2, from entering the inflow chamber IC.

The wet tank T may provide the storage space Th. The storage space Th may be used to store the cleaning solution exhausted through the discharge pipe BC.

The inflow chamber IC may be coupled to a bottom portion RB of the scrubber housing R. For example, the inflow chamber IC may be provided to penetrate the bottom portion RB of the scrubber housing R. The inflow chamber IC may provide a mixing space ICh. The mixing space ICh may be connected to the cleaning space Rh. For example, the inflow chamber IC may have an opened top portion connecting the mixing space ICh to the cleaning space Rh.

In some example embodiments, a pair of process chambers may be provided. For example, a first process chamber A1 and a second process chamber A2 may be provided. Each of the first and second process chambers A1 and A2 may have a structure that is substantially the same as or similar to the process chamber A described with reference to FIG. 1. The pair of the process chambers A1 and A2 may be connected to the inflow chamber IC.

In some example embodiments, the inflow portion GC of FIG. 1 may be provided in plural. For example, the inflow portion GC may include a first inflow portion 1 and a second inflow portion 3. The first inflow portion 1 may provide a first inflow path 1h. The first inflow portion 1 may be connected to the first process chamber A1. A gas exhausted from the first process chamber A1 may be supplied into the inflow chamber IC through the first inflow portion 1 by a first compressor C1. The second inflow portion 3 may provide a second inflow path 3h. The second inflow portion 3 may be connected to the second process chamber A2. A gas exhausted from the second process chamber A2 may be supplied into the inflow chamber IC through the second inflow portion 3 by a second compressor C2.

Hereinafter, the inflow chamber IC, the first inflow portion 1, and the second inflow portion 3 will be described in more detail with reference to FIGS. 3 to 4.

Figure 3:
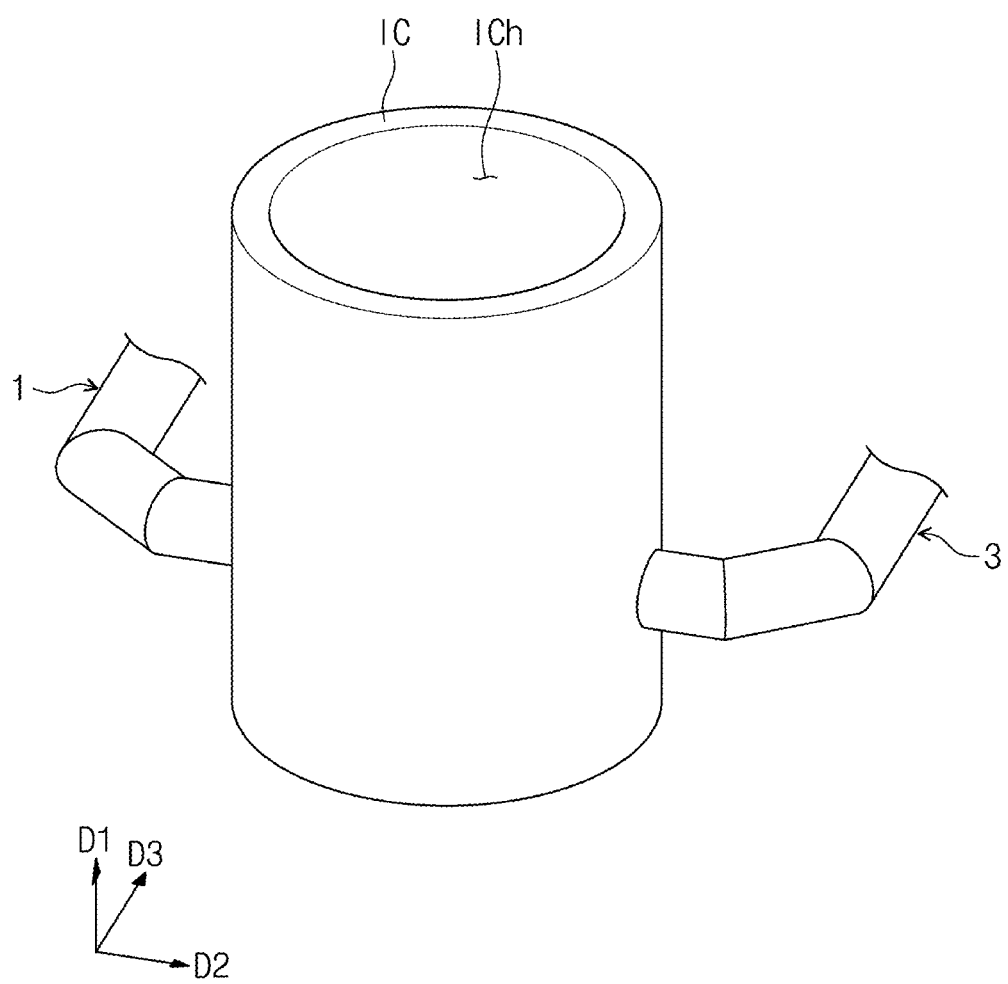
FIG. 3 is a perspective view illustrating a portion of a scrubber system according to some example embodiments of the inventive concepts.
Figure 4:
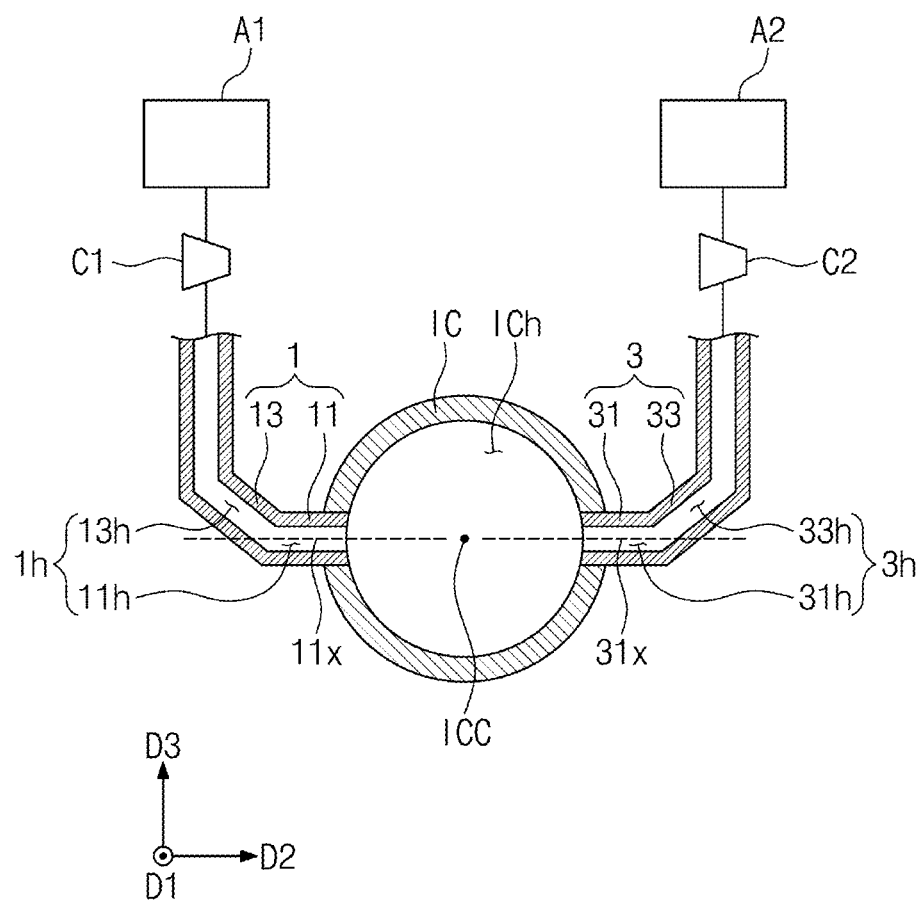
FIG. 4 is a sectioned plan view illustrating a portion of a scrubber system according to some example embodiments of the inventive concepts.

FIG. 3 is a perspective view illustrating a portion of a scrubber system according to some example embodiments of the inventive concepts, and FIG. 4 is a sectioned plan view illustrating a portion of a scrubber system according to some example embodiments of the inventive concepts.

Referring to FIGS. 3 and 4, the inflow chamber IC may have a cylindrical shape, although other shapes may be used. The inflow chamber IC of the cylindrical shape may be vertically extended.

The first inflow portion 1 may include a first connection pipe 11 and a first extension pipe 13. The first connection pipe 11 may be coupled to the inflow chamber IC. The first connection pipe 11 may provide a first connection path 11h. The first connection path 11h may be extended in a horizontal direction (e.g., one or both of the directions D2 and D3). For example, the first connection path 11h may be extended in the horizontal direction to be connected to the mixing space ICh. In some example embodiments, the first connection path 11h may be extended in the second direction D2 to be connected to the mixing space ICh. For this, the first connection pipe 11 defining the first connection path 11h may also be extended in the second direction D2. The first extension pipe 13 may be connected to the first connection pipe 11. The first extension pipe 13 may provide a first extension path 13h. The first connection path 11h and the first extension path 13h may be connected to each other. For example, the first connection path 11h and the first extension path 13h may be connected to each other to define a single first inflow path 1h. The extension direction of the first extension path 13h may be variously changed. For example, the first extension path 13h may have a bending structure including at least two portions which are respectively extended in the second and third directions D2 and D3 and are connected to each other. A gas, which is exhausted from the first process chamber A1, may be supplied into the mixing space ICh through the first extension path 13h and the first connection path 11h. Since the first connection path 11h is extended in the second direction D2, a gas, which is supplied into the mixing space ICh through the first connection path 11h, may move in the second direction D2 by a specific length.

The second inflow portion 3 may include a second connection pipe 31 and a second extension pipe 33. The second connection pipe 31 may be coupled to the inflow chamber IC. For example, the second connection pipe 31 may be coupled to a portion of the inflow chamber IC, which is opposite to the first connection pipe 11 relative to the inflow chamber IC. More specifically, the first connection pipe 11 may be provided to have an imaginary extension axis 11x passing through a center ICC of the inflow chamber IC in a plan view, and the second connection pipe 31 may be provided to an opposite portion of the first connection pipe 11, which is placed on the imaginary extension axis 11x. When viewed in a plan view, the center ICC of the inflow chamber IC may be placed at a center of weight of a shape that is defined by an outer line of the inflow chamber IC. For example, in the case where the inflow chamber IC is shaped like a circular cylinder, the center ICC of the inflow chamber IC may coincide with a center of the circle defined by the outer line of the inflow chamber IC, when viewed in a plan view. The second connection pipe 31 may provide a second connection path 31h. The second connection path 31h may be extended in a horizontal direction. The second connection path 31h may be extended in the horizontal direction and may be connected to the mixing space ICh. More specifically, the second connection path 31h may be extended in a direction, which is opposite to the extension direction of the first connection path 11h, and may be connected to the mixing space ICh. For example, an angle of between the extension directions of the first and second connection paths 11h and 31h may be about 180°. In other words, the second connection path 31h may be extended in an opposite direction of the second direction D2 and may be connected to the mixing space ICh. For this, the second connection pipe 31 defining the second connection path 31h may also be extended in the opposite direction of the second direction D2. However, the inventive concepts are not limited to these examples, and in some example embodiments, the first and second connection paths 11h and 31h may be disposed to have an angle, which is different from 180°, as long as they are disposed at two different or opposite portions of the inflow chamber IC. Further, in some example embodiments, the first and second connection paths 11h and 31h may extend partially in the first direction D1, that is, the first and second connection paths 11h and 31h may be tilted in the first direction D1.

The second extension pipe 33 may be connected to the second connection pipe 31. The second extension pipe 33 may provide a second extension path 33h. The second connection path 31h and the second extension path 33h may be connected to each other. The second connection path 31h and the second extension path 33h may be connected to each other to define a single second inflow path 3h. The extension direction of the second extension path 33h may be variously changed. For example, the second extension path 33h may be formed to extend in a direction that is oblique to both of the second and third direction D2 and D3. The gas, which is exhausted from the second process chamber A2, may be supplied into the mixing space ICh through the second extension path 33h and the second connection path 31h. Since the second connection path 31h is extended in the opposite direction of the second direction D2, a gas, which is supplied into the mixing space ICh through the second connection path 31h, may move in the opposite direction of the second direction D2 by a specific length.

When viewed in a plan view, the extension axis 11x of the first connection path 11h and an extension axis 31x of the second connection path 31h may be located on a single straight line. In addition, when viewed in a plan view, the extension axis 11x of the first connection path 11h and the extension axis 31x of the second connection path 31h may pass through the center ICC of the inflow chamber IC. However, the inventive concepts are not limited to these examples, and when viewed in a plan view, the first connection path 11h and the second connection path 31h may be provided in such a way that the extension axis 11x is inclined to the extension axis 31x at an angle.

Figure 5:
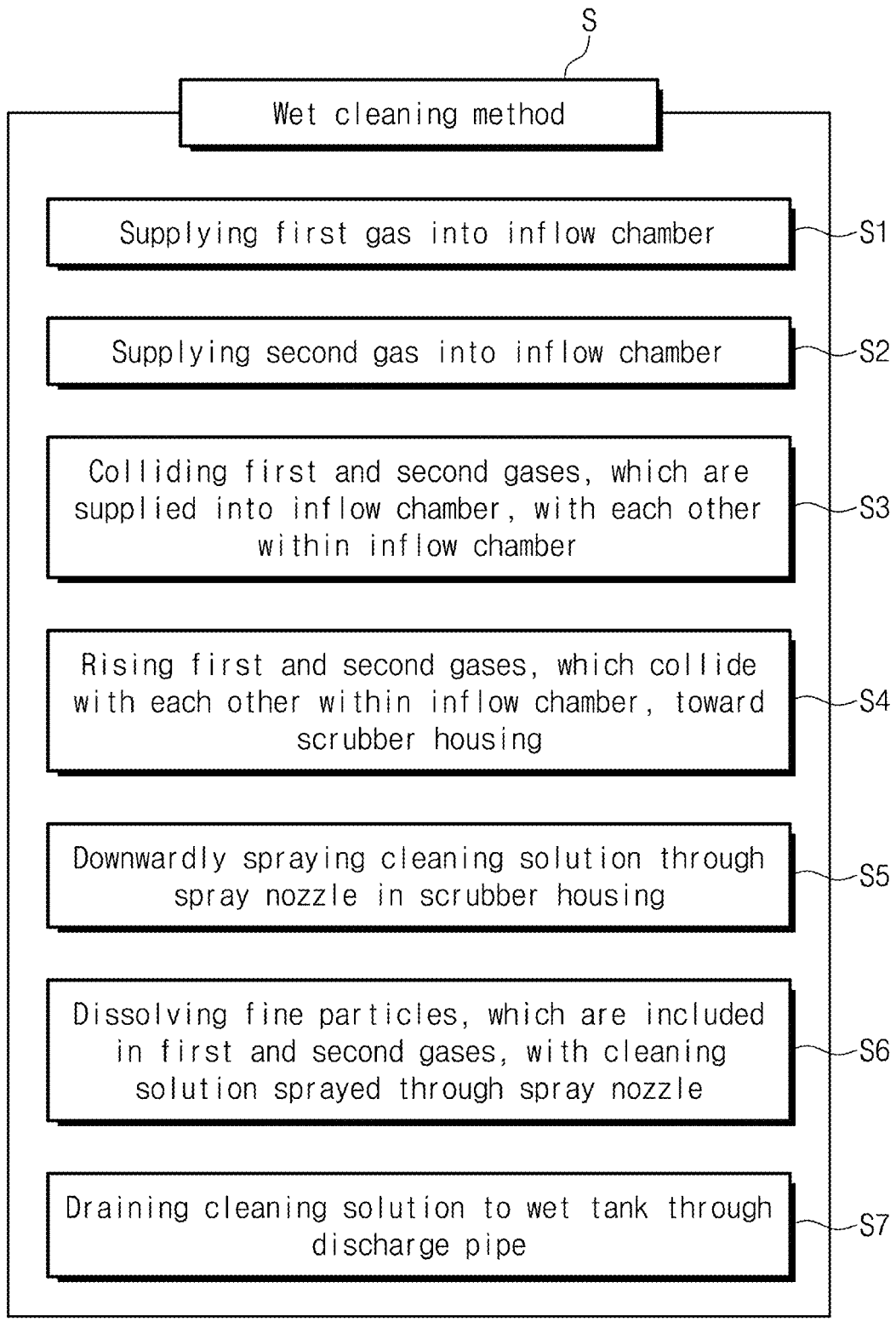
FIG. 5 is a flow chart illustrating a wet cleaning method using a scrubber system according to some example embodiments of the inventive concepts.

FIG. 5 is a flow chart illustrating a wet cleaning method using a scrubber system according to some example embodiments of the inventive concepts.

Referring to FIG. 5, a wet cleaning method S may be performed. The wet cleaning method S may be performed to clean a gas, which is exhausted from the process chamber A (e.g., see FIG. 1), using the scrubber system B of FIG. 1.

The wet cleaning method S may include supplying a first gas into an inflow chamber (in S1), supplying a second gas into the inflow chamber (in S2), colliding the first and second gases, which are supplied into the inflow chamber, with each other within the inflow chamber (in S3), rising the first and second gases, which collide with each other within the inflow chamber, toward a scrubber housing (in S4), downwardly spraying the cleaning solution through a spray nozzle in the scrubber housing (in S5), dissolving fine particles, which are included in the first and second gases, with the cleaning solution sprayed through the spray nozzle (in S6), and draining the cleaning solution to a wet tank through a discharge pipe (in S7).

Hereinafter, each step in the wet cleaning method S of FIG. 5 will be described in more detail with reference to FIGS. 6 to 8.

Figure 6:
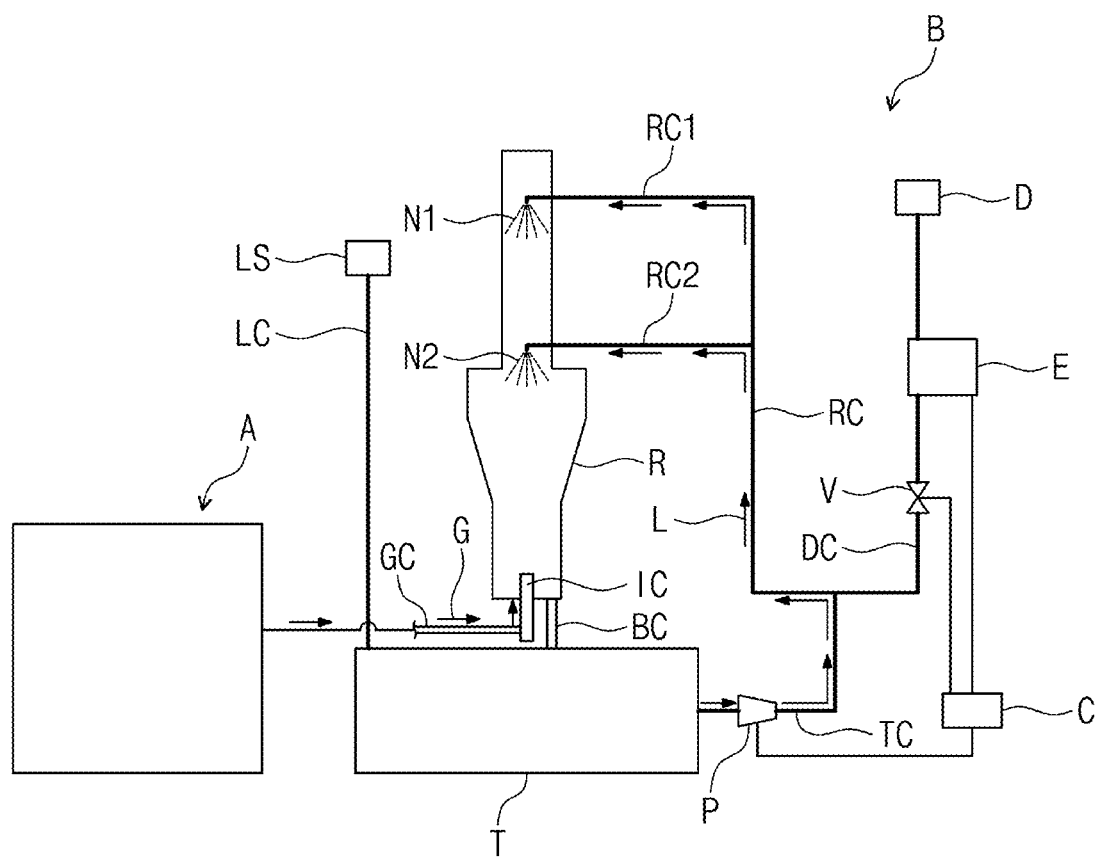
FIG. 6 is a schematic diagram illustrating a process of operating a scrubber system in the wet cleaning method of FIG. 5.
Figure 7:
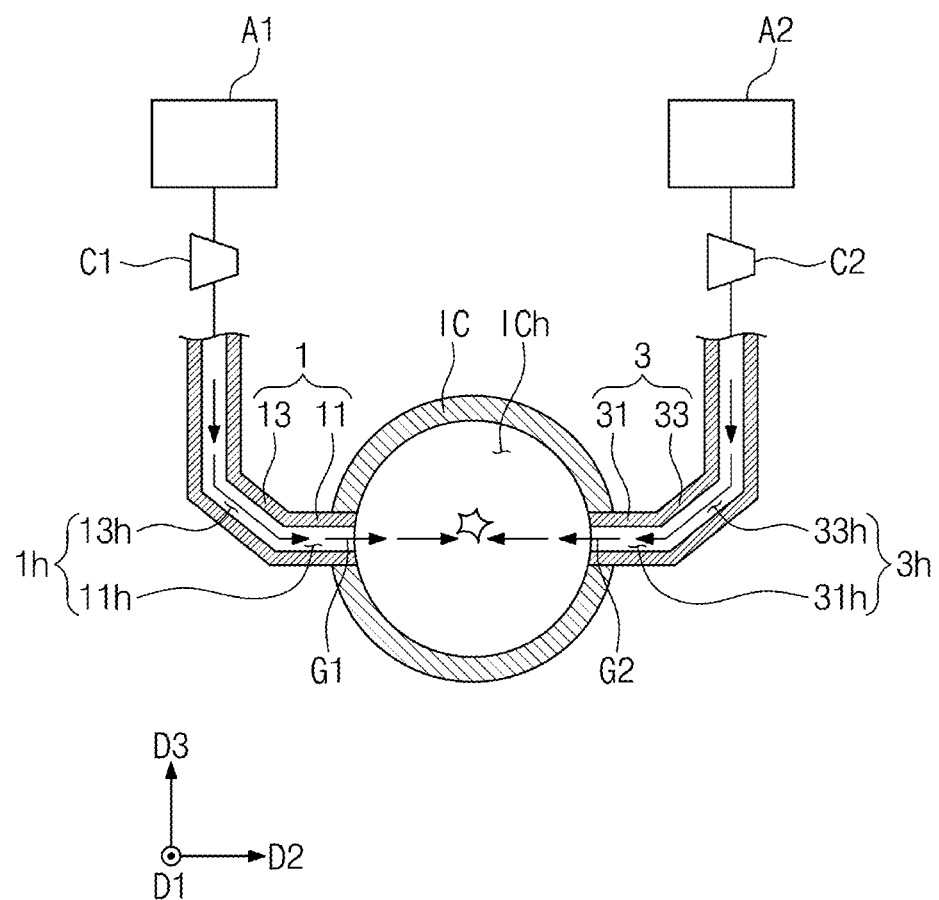
FIG. 7 is a sectioned plan view illustrating a process of operating a scrubber system in the wet cleaning method of FIG. 5.
Figure 8:
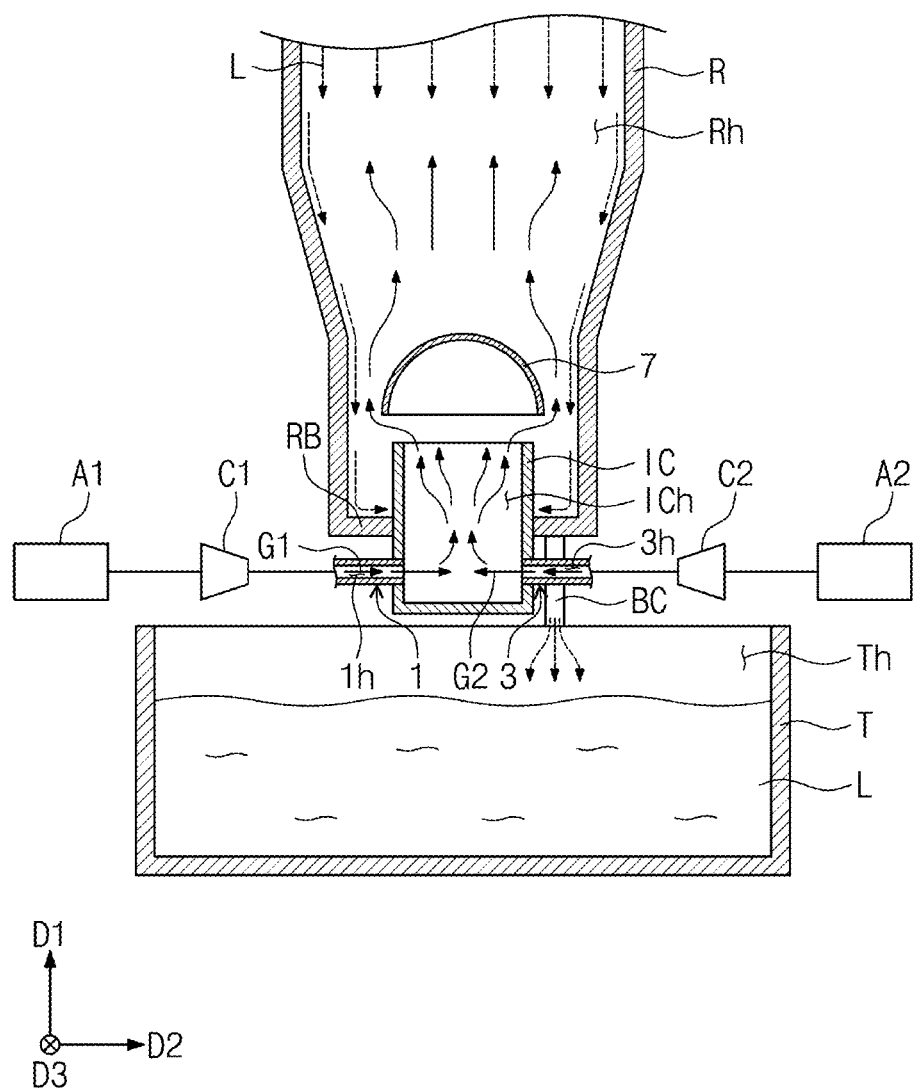
FIG. 8 is a sectional view illustrating a process of operating a scrubber system in the wet cleaning method of FIG. 5.

FIG. 6 is a schematic diagram illustrating a process of operating a scrubber system in the wet cleaning method of FIG. 5, FIG. 7 is a sectioned plan view illustrating a process of operating a scrubber system in the wet cleaning method of FIG. 5, and FIG. 8 is a sectional view illustrating a process of operating a scrubber system in the wet cleaning method of FIG. 5.

Referring to FIGS. 5 to 7, the supplying of the first gas into the inflow chamber (in S1) may include supplying a first gas G1 from the first process chamber A1 to the inflow chamber IC through the first inflow portion 1. More specifically, the first gas G1 may be supplied into the mixing space ICh through the first inflow path 1h. Since the supplying of the first gas G1 is performed through the first connection path 11h extending in the second direction D2, the first gas G1 may move in the second direction D2 by a specific length immediately after the first gas G1 is supplied into the mixing space ICh. The first gas G1 may be a gas that is exhausted from the first process chamber A1 after a fabrication process on a semiconductor wafer. In some example embodiments, the first gas G1 may contain a specific ingredient. More specifically, the first gas G1 may contain $TiCl_4$, $NH_3$, $HCl$, and/or $Cl_2$. However, the inventive concepts are not limited to these examples, and the first gas G1 may include any other material.

The supplying of the second gas into the inflow chamber (in S2) may include supplying a second gas G2 from the second process chamber A2 to the inflow chamber IC through the second inflow portion 3. More specifically, the second gas G2 may be supplied into the mixing space ICh through the second inflow path 3h. Since the supplying of the second gas G2 is performed through the second connection path 31h extended in the opposite direction of the second direction D2, the second gas G2 may move in the opposite direction of the second direction D2 by a specific length immediately after the second gas G2 is supplied into the mixing space ICh. The second gas G2 may be a gas that is exhausted from the second process chamber A2 after a fabrication process on a semiconductor wafer. In some example embodiments, the second gas G2 may include a specific ingredient. More specifically, the second gas G2 may contain $TiCl_4$, $NH_3$, $HCl$, and/or $Cl_2$. However, the inventive concepts are not limited to these examples, and the second gas G2 may include any other material. Further, the first and second gases G1 and G2 may contain the same or different material.

The colliding of the first and second gases within the inflow chamber (in S3) may include colliding the first gas G1 with the second gas G2. More specifically, the first gas G1, which is injected in the second direction D2, and the second gas G2, which is injected in the opposite direction of the second direction D2, may collide with each other near a center of the mixing space ICh. During the collision of the first and second gases G1 and G2, a specific ingredient in the first gas G1 may also collide with a specific ingredient in the second gas G2. In this case, the specific ingredients in the first and second gases G1 and G2 may form a lump. More specifically, in the case where the specific ingredient in the first gas G1 collides with the specific ingredient in the second gas G2, they may form a powdered lump. For example, molecules of $TiCl_4$ may form a powdered lump. Other ingredients may also form a solidified lump.

Referring to FIGS. 5 to 8, the rising of the gases toward the scrubber housing after the collision (in S4) may include rising the first and second gases G1 and G2 toward an upper region of the mixing space ICh to supply the first and second gases G1 and G2 into the cleaning space Rh. Due to pressure applied from the first and second compressors C1 and C2, the first and second gases G1 and G2 may be risen in an upward direction (e.g., up in the first direction D1). The first and second gases G1 and G2 may be risen in the upward direction along a detour path around the inflow chamber protection member 7.

The downward spraying of the cleaning solution through the spray nozzle in the scrubber housing (in S5) may include spraying a cleaning solution L toward the cleaning space Rh through the spray nozzles N1 and N2 (e.g., see FIG. 1).

The dissolving of the ingredients of the first and second gases with the cleaning solution (in S6) may include dissolving or hydrolyzing the powdered and solidified materials, which are contained in each of the first and second gases G1 and G2, using the cleaning solution L. For example, in the case where the cleaning solution L contains the water ($H_2O$), the cleaning solution L may hydrolyze $TiCl_4$ through the following reaction.

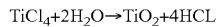

$$TiCl_4 + 2H_2O \rightarrow TiO_2 + 4HCL$$

Other fine particles, powdered and solidified materials, or the like may be dissolved (e.g., neutralized) in the cleaning solution L. More specifically, $NH_3$, HCl, or $Cl_2$ may be dissolved (e.g., neutralized) in the cleaning solution L.

The draining of the cleaning solution to the wet tank through the discharge pipe (in S7) may include transferring the cleaning solution L, which contains various dissolved, hydrolyzed, and/or otherwise neutralized contamination materials, along an inner side surface of the scrubber housing R or in a downward direction (e.g., down in the first direction D1). The cleaning solution L may be drained to the wet tank T through the discharge pipe BC. The cleaning solution L may be collected in the storage space Th of the wet tank T.

The subsequent steps may be performed in the same manner as described with reference to FIG. 1. In other words, the cleaning solution L may be circulated through the tank connection pipe TC, the discharge pump P, and the re-supply pipe RC. In the case where the contamination level of the cleaning solution L is increased above a predetermined (or, alternatively, desired or threshold) value, the cleaning solution L may be exhausted to the outside through the drain pipe DC, the discharge valve V, and the drain device D.

In the scrubber system and the wet cleaning method using the same according to some example embodiments of the inventive concepts, since the first and second gases are injected into opposite directions in the inflow chamber, the first and second gases may collide with each other. Accordingly, the specific ingredient in the first gas and the specific ingredient in the second gas may form powder. In other words, the specific ingredients may form a lump, and the lump may grow in size as the collision continues. In the case where the gases are solidified by the collision, they may have a reduced volume, and thus, they may be more easily dissolved, hydrolyzed, and/or otherwise neutralized using just a small amount of water. Thus, it may be possible to reduce an amount of consumed water. In addition, it may be possible to increase the process efficiency in the cleaning process and to prevent or reduce the environment from being contaminated by the process gas or the cleaning water.

In the scrubber system and the wet cleaning method using the same according to some example embodiments of the inventive concepts, a contamination material in the process gas may be effectively removed using just the hydrolysis and dissolving reaction, and this may make it possible to simplify the structure of the scrubber system. In other words, it may be unnecessary to provide an additional combustion device to decompose $TiCl_4$ or the like and thus, the structure of the scrubber system may be simplified. Accordingly, it may be possible to reduce the total cost for the scrubbing or cleaning process and to reduce a failure rate of the system. In addition, since the structure is simplified, it may be possible to prevent or reduce fine particles from causing a pipe clogging issue.

Figure 9:
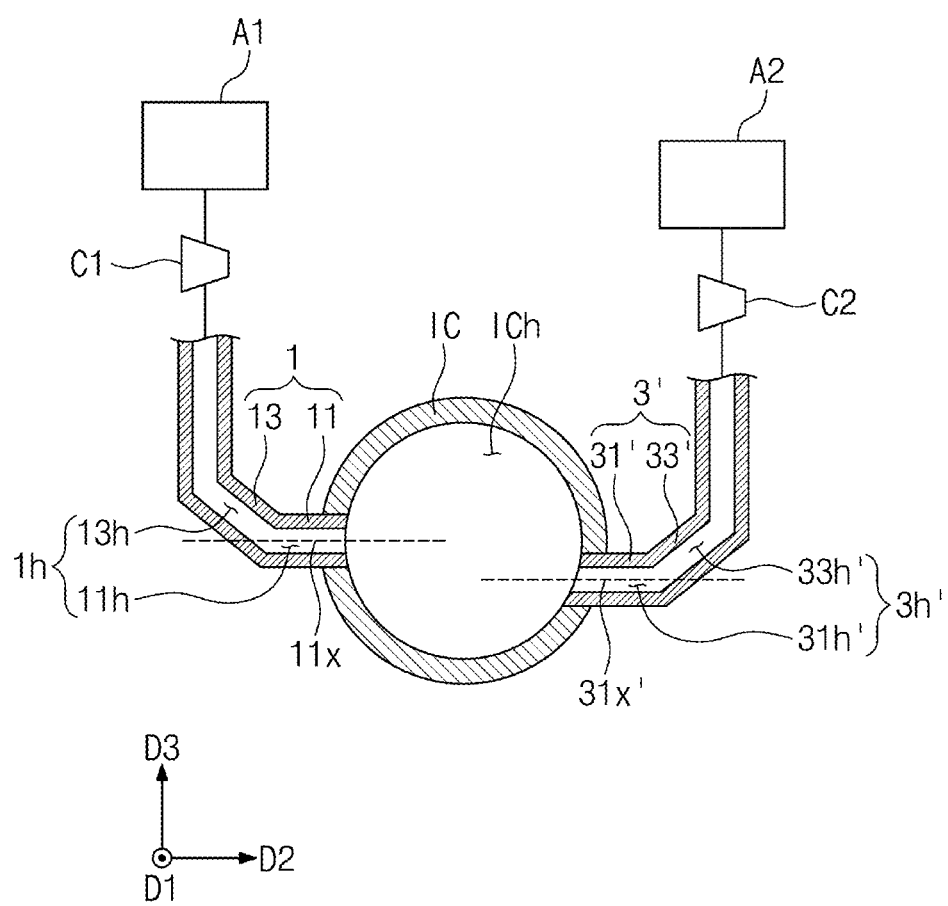
FIG. 9 is a sectioned plan view illustrating a portion of a scrubber system according to some example embodiments of the inventive concepts.

FIG. 9 is a sectioned plan view illustrating a portion of a scrubber system according to some example embodiments of the inventive concepts.

For concise description, an element previously described with reference to FIGS. 1 to 8 may be identified by the same reference number without repeating an overlapping description thereof.

Referring to FIG. 9, the second inflow portion 3' may have a different structure from that described with reference to FIG. 4. For example, the extension axis 31x' of the second connection pipe 31' of the second inflow portion 3' may not be located on the same line as the extension axis 11x of the first connection pipe 11. Nevertheless, the second connection pipe 31' may be provided in such a way that the extension axis 31x' is substantially parallel to the extension axis 11x of the first connection pipe 11. Even when the extension axis 31x' of the second connection pipe 31' is not located on the same line as the extension axis 11x of the first connection pipe 11, the first connection path 11h may be extended in a direction that is opposite to the second connection path 31h'. In other words, since the first connection pipe 11 and the second connection pipe 31' are connected to opposite portions of the inflow chamber IC, the first gas, which is supplied into the mixing space ICh through the first connection pipe 11, may collide with the second gas, which is supplied into the mixing space ICh through the second connection pipe 31', within the mixing space ICh. Accordingly, ingredients in the first and second gases may collide with each other to form a solidified material. Thus, even when the scrubber system as discussed in some example embodiments is used, it may be possible to realize substantially the same or similar effect as the scrubber system described with reference to FIG. 4.

Figure 10:
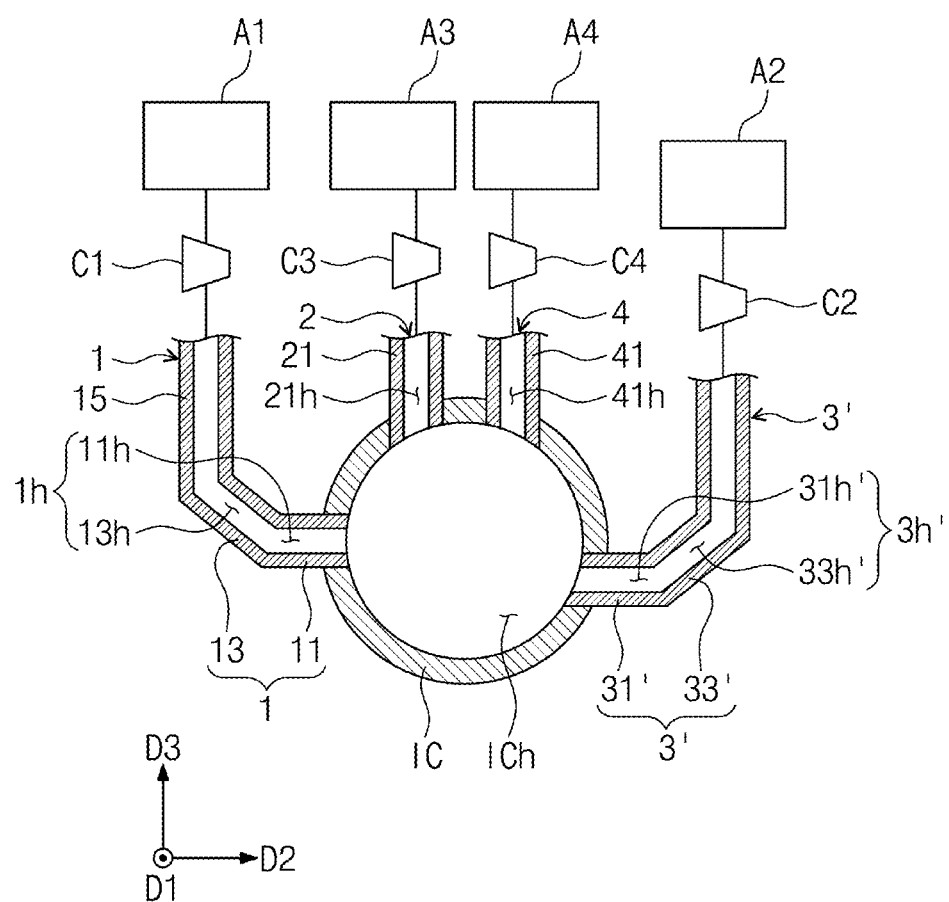
FIG. 10 is a sectioned plan view illustrating a portion of a scrubber system according to some example embodiments of the inventive concepts.

FIG. 10 is a sectioned plan view illustrating a portion of a scrubber system according to some example embodiments of the inventive concepts.

For concise description, an element previously described with reference to FIGS. 1 to 9 may be identified by the same reference number without repeating an overlapping description thereof.

Referring to FIG. 10, the scrubber system may further include a third process chamber A3, a fourth process chamber A4, a third inflow portion 2, a fourth inflow portion 4, a third compressor C3, and a fourth compressor C4.

Each of the third and fourth process chambers A3 and A4 may be configured to have substantially the same structure as the process chamber A described with reference to FIG. 1. In some example embodiments, all of the four process chambers A1, A2, A3, and A4 may be connected in common to the inflow chamber IC.

The third inflow portion 2 may include a third connection pipe 21. The third connection pipe 21 may provide a third connection path 21h. In some example embodiments, the third connection path 21h may be extended in an opposite direction of the third direction D3 to be connected to the mixing space ICh. The third inflow portion 2 may be connected to the third process chamber A3. The gas exhausted from the third process chamber A3 may be supplied to the inflow chamber IC through the third inflow portion 2 by the third compressor C3.

The fourth inflow portion 4 may include a fourth connection pipe 41. The fourth connection pipe 41 may provide a fourth connection path 41h. In some example embodiments, the fourth connection path 41h may be extended in the opposite direction of the third direction D3 to be connected to the mixing space ICh. The fourth inflow portion 4 may be connected to the fourth process chamber A4. The gas, which is exhausted from the fourth process chamber A4, may be supplied into the inflow chamber IC through the fourth inflow portion 4 by the fourth compressor C4.

In the scrubber system and the wet cleaning method using the same according to some example embodiments of the inventive concepts, four process chambers may be connected to a single inflow chamber. In some example embodiments, the gases exhausted from the four process chambers may be simultaneously supplied into the single inflow chamber.

Alternatively, the gases exhausted from the four process chambers may be sequentially supplied into the single inflow chamber. Alternatively, only the gases exhausted from the first and second process chambers may be ceaselessly supplied into the inflow chamber, and the gases exhausted from the third and fourth process chambers may be intermittently supplied into the inflow chamber.

Figure 11:
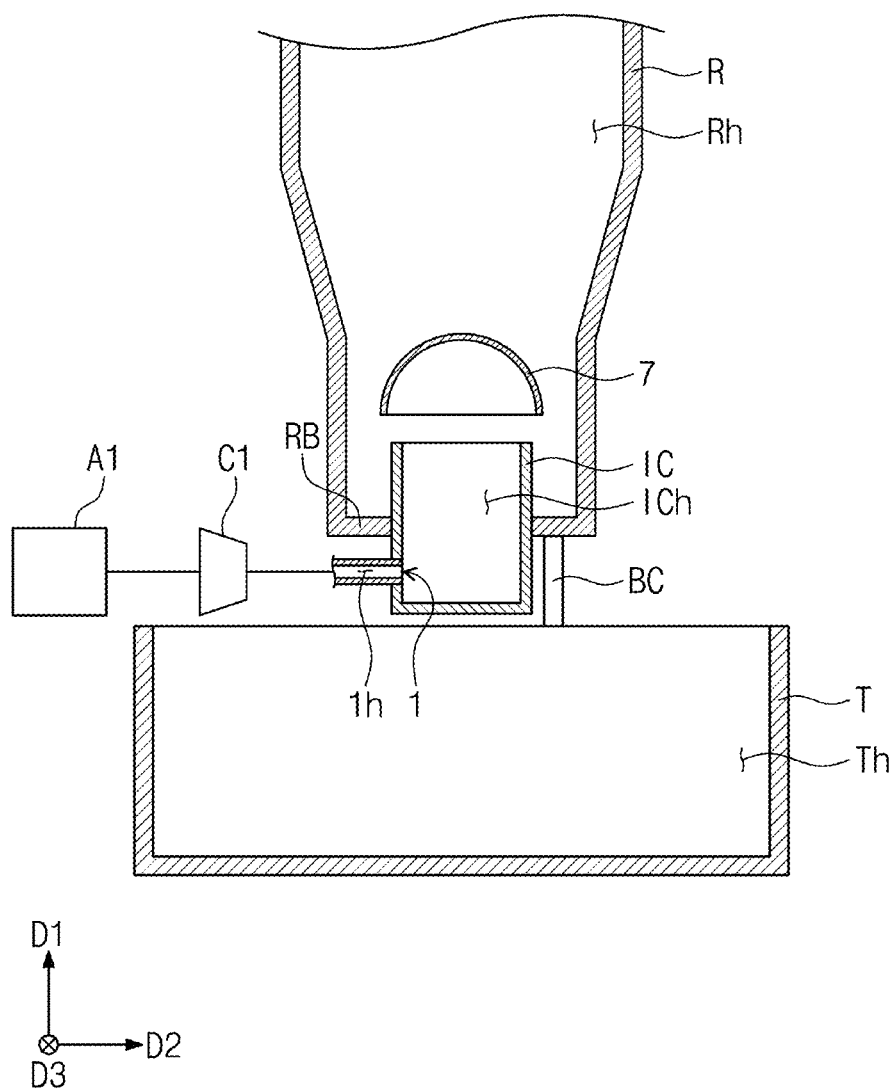
FIG. 11 is a sectional view illustrating a portion of a scrubber system according to some example embodiments of the inventive concepts.
Figure 12:
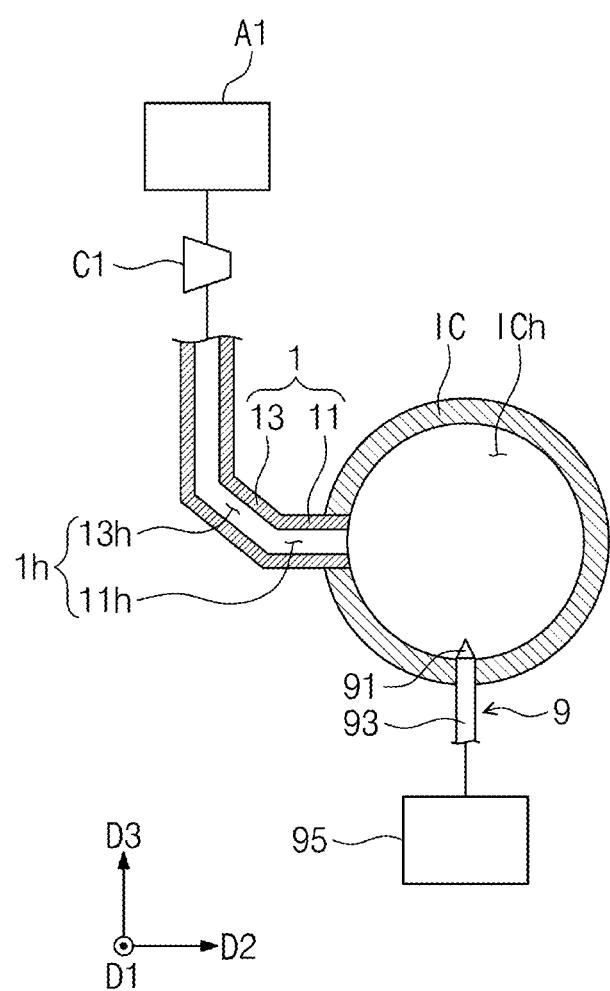
FIG. 12 is a sectioned plan view illustrating a portion of a scrubber system according to some example embodiments of the inventive concepts.

FIG. 11 is a sectional view illustrating a portion of a scrubber system according to some example embodiments of the inventive concepts, and FIG. 12 is a sectioned plan view illustrating a portion of a scrubber system according to some example embodiments of the inventive concepts.

For concise description, an element previously described with reference to FIGS. 1 to 10 may be identified by the same reference number without repeating an overlapping description thereof.

Referring to FIGS. 11 and 12, only the first process chamber A1 may be connected to one inflow chamber IC. For example, the first inflow portion 1 and the first compressor C1 may be only provided. The first connection path 11h may be extended in a horizontal direction to be connected to the mixing space ICh.

The scrubber system may further include a mixing gas supplying part 9. The mixing gas supplying part 9 may be configured to supply a mixing gas to the inflow chamber IC. More specifically, the mixing gas supplying part 9 may be used to supply a mixing gas toward a first gas, which is supplied into the mixing space ICh along the first inflow portion 1. The mixing gas may include an inert or inactive gas. For example, the mixing gas may include a nitrogen (N2) gas. The mixing gas supplying part 9 may include a mixing gas nozzle 91, a mixing gas connection pipe 93, and a mixing gas supply device 95. The mixing gas nozzle 91 may be coupled to the inflow chamber IC. The mixing gas nozzle 91 may be provided on an inner side surface of the inflow chamber IC. More specifically, the mixing gas nozzle 91 may be disposed to spray the mixing gas toward the mixing space ICh. For example, the mixing gas nozzle 91 may be provided to spray the mixing gas ion a direction that is not parallel to the extension direction of the first connection path 11h. For example, the mixing gas nozzle 91 may be provided to spray the mixing gas in the third direction D3. The mixing gas nozzle 91 may be connected to the mixing gas connection pipe 93. The mixing gas nozzle 91 may spray the mixing gas, which is supplied through the mixing gas connection pipe 93, into the mixing space ICh. The mixing gas supply device 95 may be connected to the mixing gas connection pipe 93. The mixing gas supply device 95 may supply the mixing gas to the mixing gas connection pipe 93.

Figure 13:
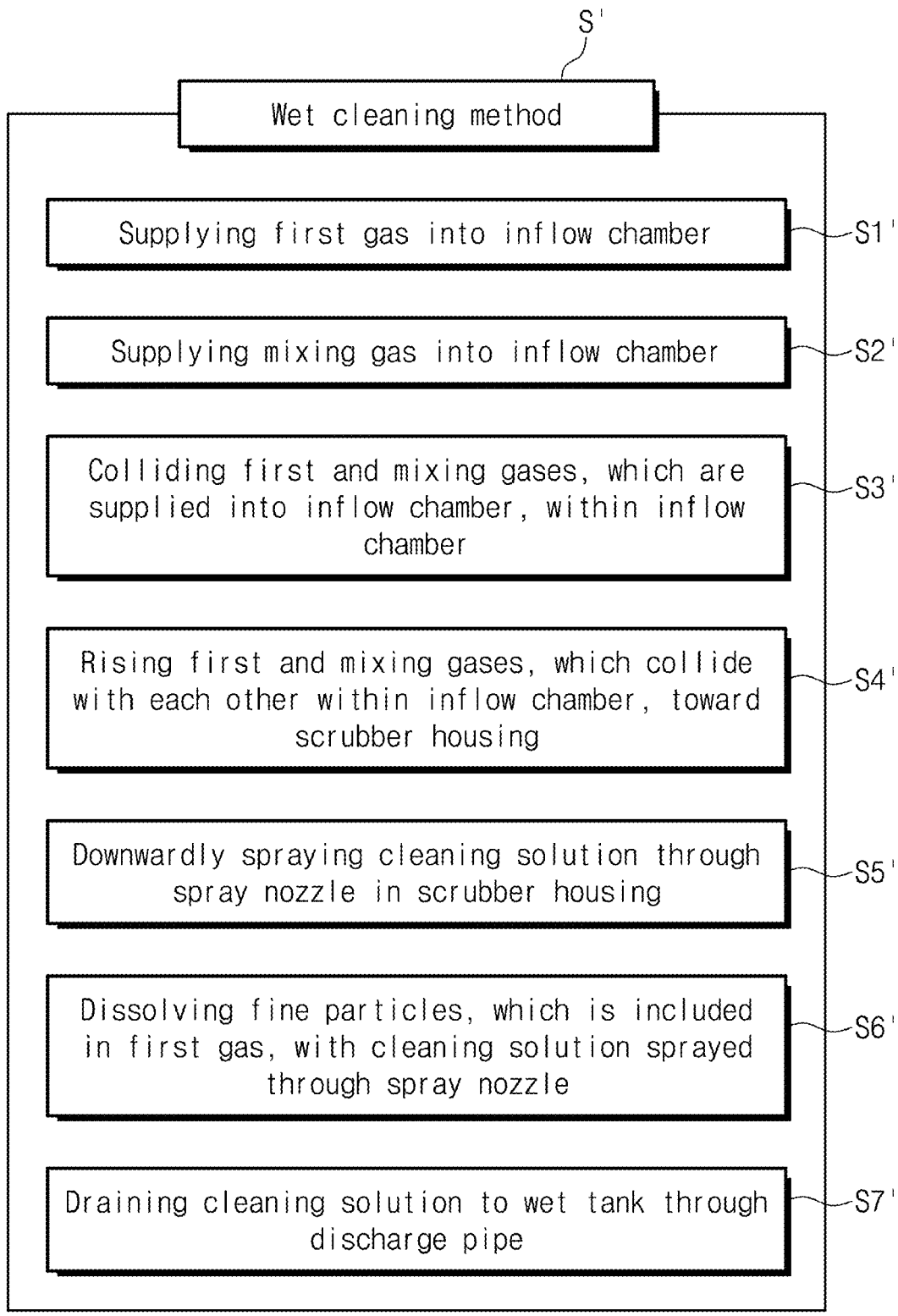
FIG. 13 is a flow chart illustrating a wet cleaning method using a scrubber system according to some example embodiments of the inventive concepts.

FIG. 13 is a flow chart illustrating a wet cleaning method using a scrubber system according to some example embodiments of the inventive concepts.

Referring to FIG. 13, a wet cleaning method S' may include supplying a first gas into an inflow chamber (in S1'), supplying a mixing gas into the inflow chamber (in S2'), colliding the first gas and the mixing gas, which are supplied into the inflow chamber, within the inflow chamber (in S3'), rising the first gas and the mixing gas, which collide with each other within the inflow chamber, toward a scrubber housing (in S4'), downwardly spraying a cleaning solution through a spray nozzle in the scrubber housing (in S5'), dissolving a specific ingredient, which is included in the first gas, with the cleaning solution sprayed through the spray nozzle (in S6'), and draining the cleaning solution to a wet tank through a discharge pipe (in S7').

Hereinafter, each step in the wet cleaning method S' of FIG. 13 will be described in more detail with reference to FIGS. 14 to 15.

Figure 14:
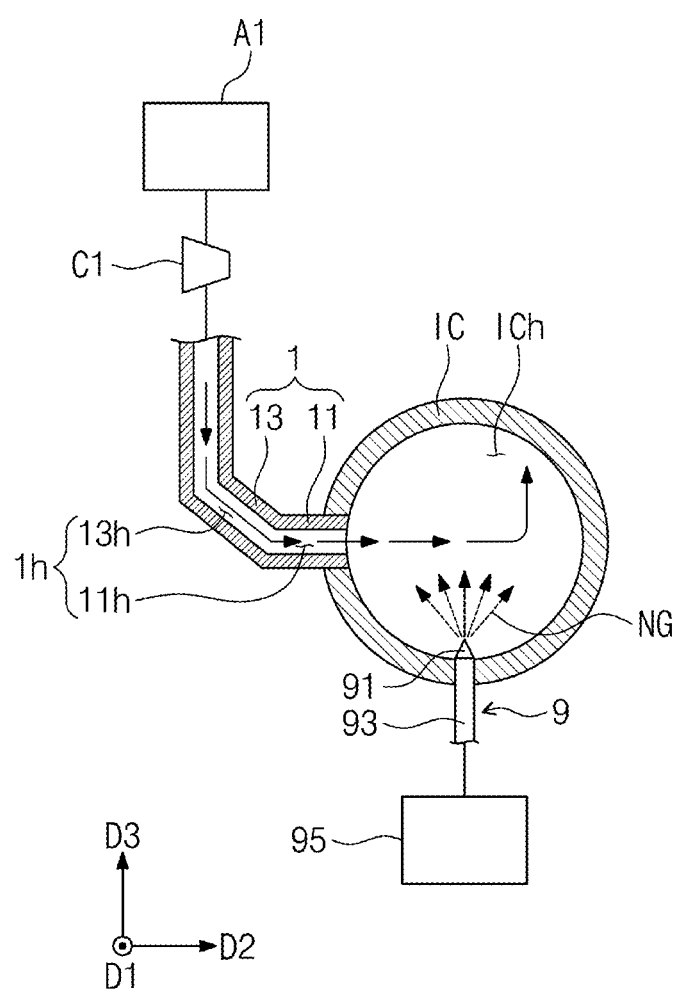
FIG. 14 is a sectioned plan view illustrating a process of operating a scrubber system in the wet cleaning method of FIG. 13.
Figure 15:
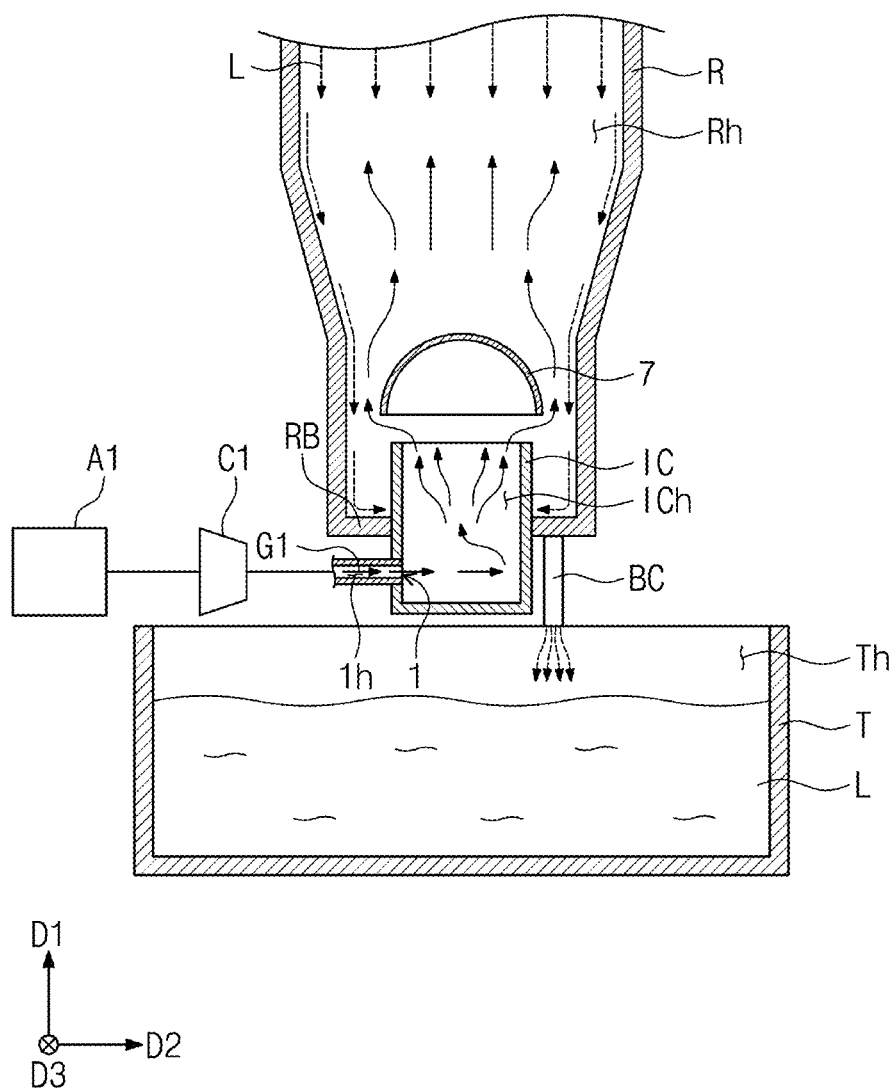
FIG. 15 is a sectional view illustrating a process of operating a scrubber system in the wet cleaning method of FIG. 13.

FIG. 14 is a sectioned plan view illustrating a process of operating a scrubber system in the wet cleaning method of FIG. 13, and FIG. 15 is a sectional view illustrating a process of operating a scrubber system in the wet cleaning method of FIG. 13.

Referring to FIGS. 12, 13, and 14, the supplying of the first gas into the inflow chamber (in S1') may be performed in substantially the same or similar manner as the supplying of the first gas into the inflow chamber (in S1) (e.g., see FIG. 5), described with reference to the flow chart of FIG. 5.

The supplying of the mixing gas into the inflow chamber (in S2') may include supplying the mixing gas to the mixing space ICh using the mixing gas supplying part 9. More specifically, if the mixing gas supply device 95 supplies a mixing gas NG, the mixing gas NG may be sprayed to the mixing space ICh from the mixing gas nozzle 91 through the mixing gas connection pipe 93. Since the mixing gas nozzle 91 is oriented in the third direction D3, the mixing gas NG may be sprayed into the mixing space ICh in the third direction D3.

The colliding of the first gas and the mixing gas within the inflow chamber (in S3') may include colliding the first gas G1 with the mixing gas NG within the mixing space ICh. More specifically, while the first gas G1 propagates in the second direction D2, the mixing gas NG may propagate in the third direction D3 and may collide with the first gas G1. As a result of the collision with the mixing gas NG, the first gas G1 may form a vortex or eddy or may collide with an inner side surface of the inflow chamber IC. In this case, specific ingredients in the first gas G1 may collide with each other. Accordingly, the ingredients in the first gas G1 may form powder.

The rising of the first gas and the mixing gas toward the scrubber housing after the collision (in S4') may include rising the first and mixing gases G1 and NG toward an upper region of the mixing space ICh to supply the first and mixing gases G1 and NG into the cleaning space Rh. Due to a pressure applied from the first compressor C1, the first and mixing gases G1 and NG may be risen in an upward direction. The first and mixing gases G1 and NG may be risen in the upward direction along a detour path around the inflow chamber protection member 7. In some example embodiments, the first and mixing gasses G1 and NG may enter the mixing space ICh at different angles.

The downward spraying of the cleaning solution through the spray nozzle in the scrubber housing (in S5') may be performed in substantially the same or similar manner as the step S5 described with reference to FIG. 5.

The dissolving of fine particles in the first gas with the cleaning solution (in S6') may be performed in substantially the same or similar manner as the step S6 described with reference to FIG. 5.

The draining of the cleaning solution to the wet tank through the discharge pipe (in S7') may be performed in substantially the same or similar manner as the step S7 described with reference to FIG. 5.

In the scrubber system and the wet cleaning method using the same according to some example embodiments of the inventive concepts, even when just one process chamber is connected to the inflow chamber, it may be possible to cause collision between ingredients in the gas using the mixing gas. Thus, even when just one kind of the gas is exhausted from the process chamber, it may be possible to produce powder from the specific ingredients in the gas. Accordingly, it may be possible to realize substantially the same or similar effect as the scrubber system described with reference to FIG. 5.

Figure 16:
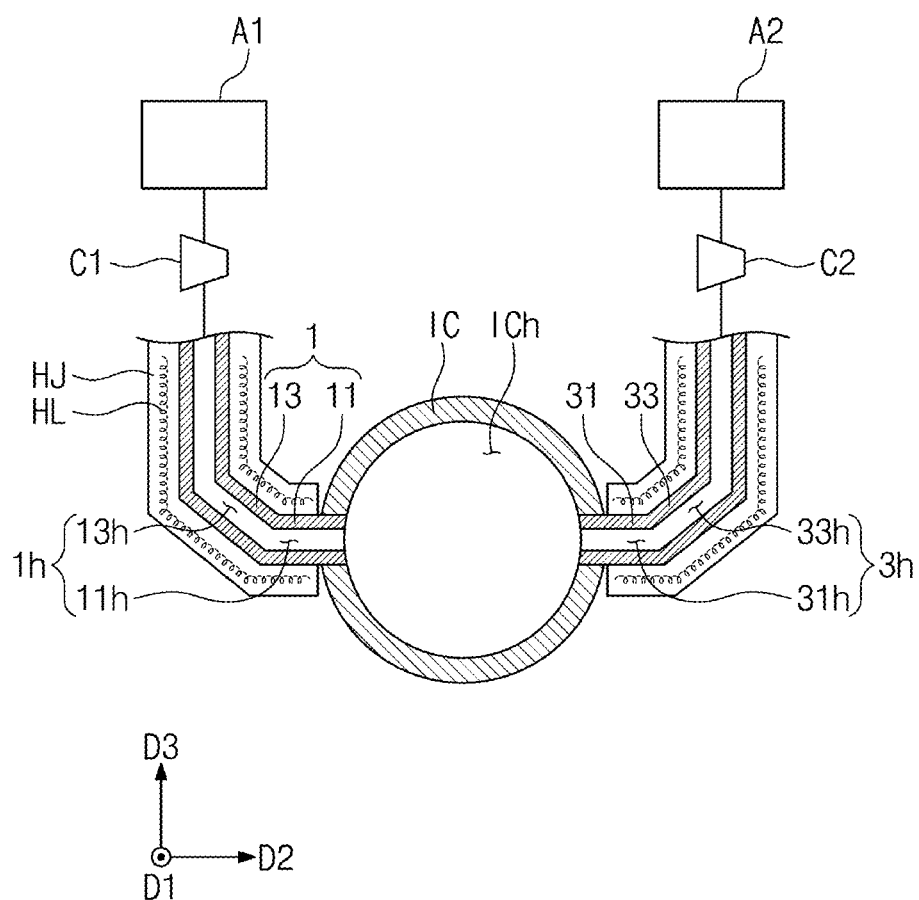
FIG. 16 is a sectioned plan view illustrating a portion of a scrubber system according to some example embodiments of the inventive concepts.

FIG. 16 is a sectioned plan view illustrating a portion of a scrubber system according to some example embodiments of the inventive concepts.

For concise description, an element previously described with reference to FIGS. 1 to 15 may be identified by the same reference number without repeating an overlapping description thereof.

Referring to FIG. 16, a heating jacket HJ and a heating device HL may be further provided. The heating jacket HJ may be provided to surround at least one of the first or second inflow portion 1 or 3. The heating jacket HJ may be formed of or include a thermally insulating material. The heating device HL may be placed in the heating jacket HJ. The heating device HL may be used to heat at least one of the first or second inflow portion 1 or 3. For this, the heating device HL may include a heating wire or the like. The heating device HL may be used to heat a temperature of at least one of the first or second inflow portion 1 or 3 to a desired (e.g., threshold) level. In addition, the heating jacket HJ may be used to maintain the temperature of at least one of the first or second inflow portion 1 or 3 at a desired (e.g., threshold) level.

In the scrubber system and the wet cleaning method using the same according to some example embodiments of the inventive concepts, the heating jacket and the heating device may be used to heat or maintain the temperature of the inflow portion to a specific level. For example, an internal part of the inflow portion may be maintained to a temperature of about 230° C. or higher by the heating device. Thus, it may be possible to prevent or reduce a specific ingredient in the gas from being early solidified, when the gas flows through in the inflow portion. In other words, it may be possible to prevent or reduce the occurrence of the gas from producing powder in an early stage when the gas is not yet supplied into the inflow chamber. For example, it may be possible to prevent or reduce the occurrence of $TiCl_4$ from forming powder in the inflow portion. Thus, it may be possible to prevent or reduce the occurrence of the pipe from being clogged by the powder in the inflow portion. Since the pipe clogging issue is prevented or reduced, it may be possible to stably control the process pressure and thereby to reduce failure of the system.

According to some example embodiments of the inventive concepts, it may be possible to realize a scrubber system and a wet cleaning method using the same, using a hydrolysis process, and thus, the inflow portion may have a simplified structure. Thus, it may be possible to easily dispose the heating jacket and the heating device near the inflow portion.

In a scrubber system and a wet cleaning method using the same according to some example embodiments of the inventive concepts, it may be possible to produce powder using a gas-to-gas collision process.

In a scrubber system and a wet cleaning method using the same according to some example embodiments of the inventive concepts, it may be possible to increase efficiency in the scrubbing or cleaning process.

According to some example embodiments of the inventive concepts, a hydrolysis reaction may be used for a scrubber system and a wet cleaning method using the same.

In a scrubber system and a wet cleaning method using the same according to some example embodiments of the inventive concepts, it may be possible to effectively perform the cleaning process using just a small amount of water.

In a scrubber system and a wet cleaning method using the same according to some example embodiments of the inventive concepts, it may be possible to simplify a structure of the scrubber system and to reduce cost for the cleaning process.

In a scrubber system and a wet cleaning method using the same according to some example embodiments of the inventive concepts, it may be possible to prevent or reduce the occurrence of a pipe clogging issue.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

While example embodiments of the inventive concepts have been particularly shown and described, it will be understood by one of ordinary skill in the art that variations in form and detail may be made therein without departing from the spirit and scope of the attached claims.

What is claimed is:

1. A wet cleaning method, comprising:
supplying a first gas from a first process chamber into an inflow chamber through a first inflow portion;
supplying a second gas from a second process chamber into the inflow chamber through a second inflow portion;
colliding the first and second gases with each other within the inflow chamber;
rising the first and second gases toward a scrubber housing that is placed on the inflow chamber, the first and second inflow portions being below the scrubber housing;
downwardly spraying a cleaning solution through a spray nozzle in the scrubber housing above the inflow chamber and the first and second inflow portions; and
hydrolyzing an ingredient, the ingredient being included in at least one of the first gas or the second gas, with the cleaning solution sprayed through the spray nozzle.

2. The method of claim 1, wherein the colliding of the first and second gases is performed to produce powder.

3. The method of claim 2, wherein the first gas or the second gas include at least one of $TiCl_4$, $NH_3$, $HCl$, or $Cl_2$.

4. The method of claim 1, wherein at least one of the first process chamber or the second process chamber include an atomic layer deposition (ALD) chamber.

5. The method of claim 1, wherein the cleaning solution dissolves the ingredient and then is drained to a wet tank below the scrubber housing.

6. The method of claim 1, wherein the scrubber housing including a cleaning space, the cleaning space being vertically extended.

7. The method of claim 6, wherein the scrubber housing having a bottom surface extending under the cleaning space.

8. The method of claim 7, wherein the inflow chamber includes a mixing space.

9. The method of claim 8, wherein the mixing space surrounded by and defined by an outer wall of the inflow chamber, the outer wall of the inflow chamber laterally overlapping with an outer wall of the scrubber housing and extending axially below the bottom surface of the scrubber housing.

10. The method of claim 8, wherein the mixing space surrounded by and defined by an outer wall of the inflow chamber, the outer wall of the inflow chamber extending axially below the bottom surface of the scrubber housing.

11. A wet cleaning method, comprising:
supplying a first gas from a first process chamber into an inflow chamber through a first inflow portion;
supplying a second gas from a second process chamber into the inflow chamber through a second inflow portion;
colliding the first and second gases with each other within the inflow chamber;
rising the first and second gases toward a scrubber housing that is placed on the inflow chamber;
downwardly spraying a cleaning solution through a spray nozzle in the scrubber housing; and
hydrolyzing an ingredient, the ingredient being included in at least one of the first gas or the second gas, with the cleaning solution sprayed through the spray nozzle,
wherein the scrubber housing including a cleaning space, the cleaning space being vertically extended, the scrubber housing having a bottom surface extending under the cleaning space, and
wherein the inflow chamber includes a mixing space surrounded by and defined by an outer wall of the inflow chamber, the outer wall of the inflow chamber laterally overlapping with an outer wall of the scrubber housing and extending axially below the bottom surface of the scrubber housing.

* * * * *